(12) United States Patent
Furukawa

(10) Patent No.: US 8,080,860 B2
(45) Date of Patent: Dec. 20, 2011

(54) SEMICONDUCTOR DEVICE AND METHOD OF BLOWING FUSE THEREOF

(75) Inventor: Hiroyuki Furukawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 226 days.

(21) Appl. No.: 12/125,324

(22) Filed: May 22, 2008

(65) Prior Publication Data

US 2008/0290455 A1    Nov. 27, 2008

(30) Foreign Application Priority Data

May 22, 2007    (JP) .................................. 2007-135876

(51) Int. Cl.
*H01L 23/52*    (2006.01)

(52) U.S. Cl. .......... 257/529; 257/E23.149; 257/E21.476

(58) Field of Classification Search ................... 257/529, 257/E23.149, E21.476
See application file for complete search history.

(56) References Cited

U.S. PATENT DOCUMENTS

| | | | |
|---|---|---|---|
| 5,888,837 A * | 3/1999 | Fillion et al. ..................... 438/15 |
| 2005/0167825 A1* | 8/2005 | Pharn et al. ..................... 257/734 |
| 2008/0180871 A1* | 7/2008 | Hebert et al. .................. 361/106 |

FOREIGN PATENT DOCUMENTS

JP    2003-007836    1/2003

* cited by examiner

*Primary Examiner* — Tan N Tran
(74) *Attorney, Agent, or Firm* — Young & Thompson

(57) ABSTRACT

A semiconductor device comprises an active region including a core circuit forming region and a buffer forming region, and a fuse element forming region arranged on a corner of the active region and to be able to be electrically fused. It is possible to arrange the fuse element without forming the fuse in the core circuit forming region by arranging the fuse element forming region at the corner of the active region.

3 Claims, 3 Drawing Sheets

SEMICONDUCTOR DEVICE AND METHOD OF BLOWING FUSE THEREOF

BACKGROUND OF THE INVENTION

1. Field of the Invention

This invention relates to semiconductor devices and more particularly to semiconductor devices which relieve memories by fuse elements and methods of blowing fuses thereof.

2. Description of Related Art

In designing a memory of a semiconductor circuit, a defective cell is generally replaced with a redundancy cell. The defect cell is replaced with the redundancy cell by blowing a fuse element which is formed in the semiconductor circuit.

On the other hand, a semiconductor circuit has recently been designed by a functional circuit unit which is called a macro, and a circuit design is performed by arranging this macro in a semiconductor circuit forming region. Japanese Unexamined Patent Application Publication No. 2003-7836 discloses an example in which a fuse element group is formed outside of a pad line when a logic circuit and a memory macro are arranged on the same substrate.

Generally, such a fuse element is prepared as a macro in circuit design, and it is arranged as a fuse element macro on a semiconductor substrate.

However, since such a fuse element macro is arranged in a circuit forming region or an external part of pads, the fuse element macro increases the area of a semiconductor chip.

SUMMARY

In one embodiment, a semiconductor device comprises an active region including a core circuit forming region and a buffer forming region, and a fuse element forming region arranged on a corner of the active region and to be able to be electrically fused.

It is possible to arrange the fuse element without forming the fuse in the core circuit forming region by arranging the fuse element forming region at the corner of the active region.

In another embodiment, a method of blowing a fuse of a semiconductor device comprises arranging a fuse element forming region at a corner of a semiconductor chip, electrically connecting a plurality of pads formed near a corner of the semiconductor chip with fuses of the fuse element forming region, and blowing the fuse by applying voltage to the plurality of pads by probing.

It is possible to fuse without fail by using pads which are not bonded at the time of mounting by fusing the fuse through the pad at the corner of the chip at the time of probing.

According to this invention, it is possible to reduce the area of a semiconductor chip.

BRIEF DESCRIPTION OF THE DRAWINGS

The above and other objects and advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
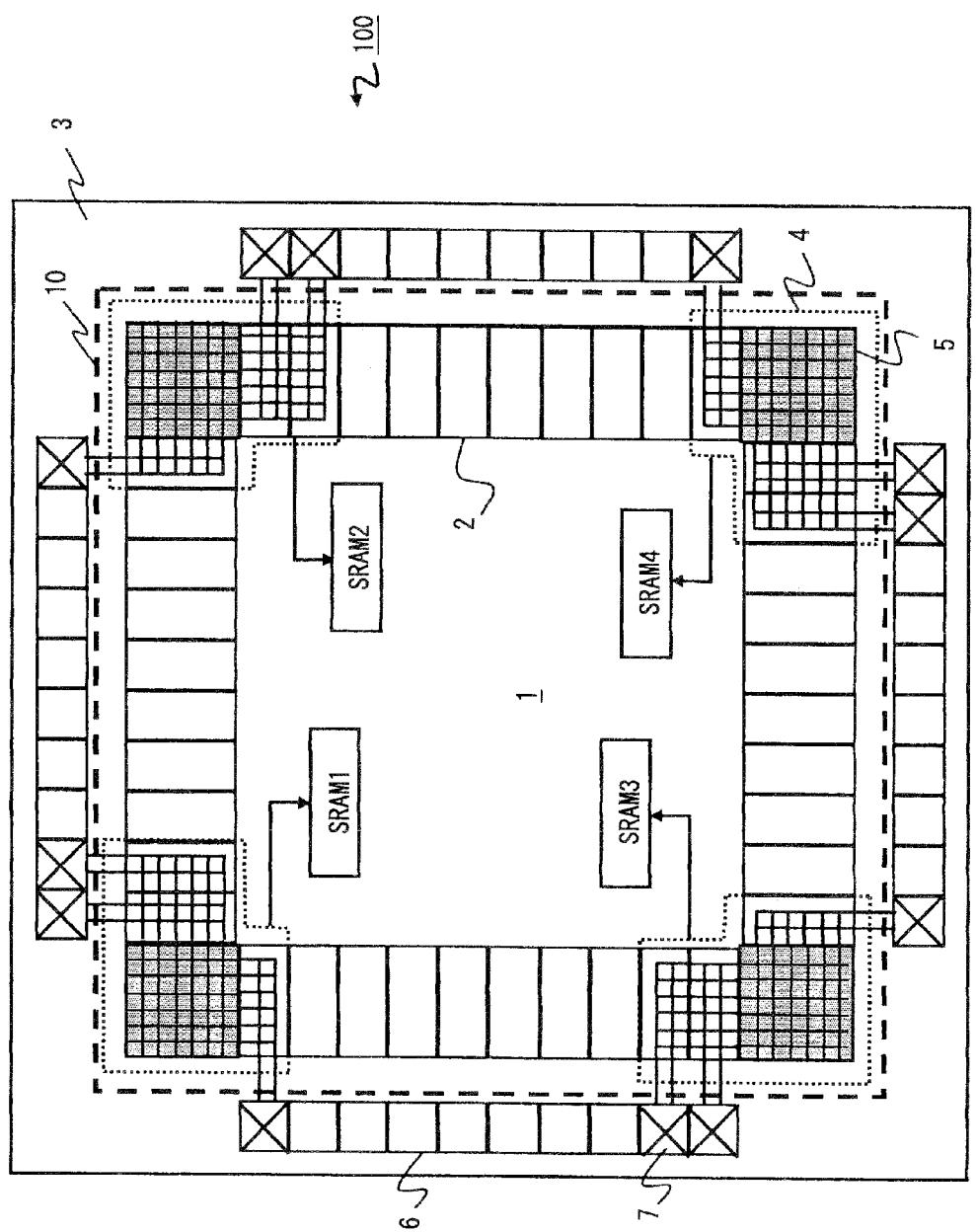
FIG. 1 is a plan view showing a semiconductor chip according to an embodiment of the present invention.

An exemplary embodiment of the present invention is described hereinafter in detail with reference to the drawings. FIG. 1 is a plan view showing a semiconductor chip 100 according to the embodiment of the present invention. As shown in FIG. 1, the semiconductor chip 100 of this embodiment includes a core circuit forming region 1, a buffer region 2, a pad forming region 3, fuse macros 4, fuse portions 5, pad lines 6 and pads for fuse 7.

The core circuit forming region 1 is a region in which a function circuit which executes a function of the semiconductor chip 100 is formed. Note that, there are SRAM1-SRAM4 as memory element regions in the core circuit forming region 1. The buffer forming region 2 is a region in which input and output buffers are formed. The core circuit forming region 1 and the buffer forming region 2 correspond to an active region 10 (see FIG. 1, dashed lines) in forming a circuit on the semiconductor substrate. The pad forming region 3 is a region in which pads connected to external terminals by wire bondings are formed, for example.

The fuse macro 4 is a macro including fuse elements placed on each corner of an active region 10. In this embodiment, the fuse macro 4 includes a part of the region near the corner of the active region 10 in the buffer region 2 and is placed as a fuse macro 4 including a wire for the fuse element which is placed in the buffer region near the corner. Each of the fuse macros is connected to SRAM1-SRAM4 respectively.

The fuse portions 5 are regions where fuses which are able to be electrically fused are placed. The pad line 6 consists of a plurality of pads formed on the pad forming region 3. The pads for fuse 7 are pads which are connected to the fuses of the fuse macros 4 out of the plurality of pads included in the pad line 6. For example, if pads are arranged linearly along a side of the chip, it is preferable for the pads for fuse 7 to be in both ends or near both ends and it is preferable to be formed near the fuse macros 4.

As described above, the fuse macros 4 are arranged on the corners of the active region 10 in this embodiment. In other words, the corners of the active region are used as the fuse element forming regions. Hereinafter, the arrangement of the fuse macros 4 will be described.

Figure 2:
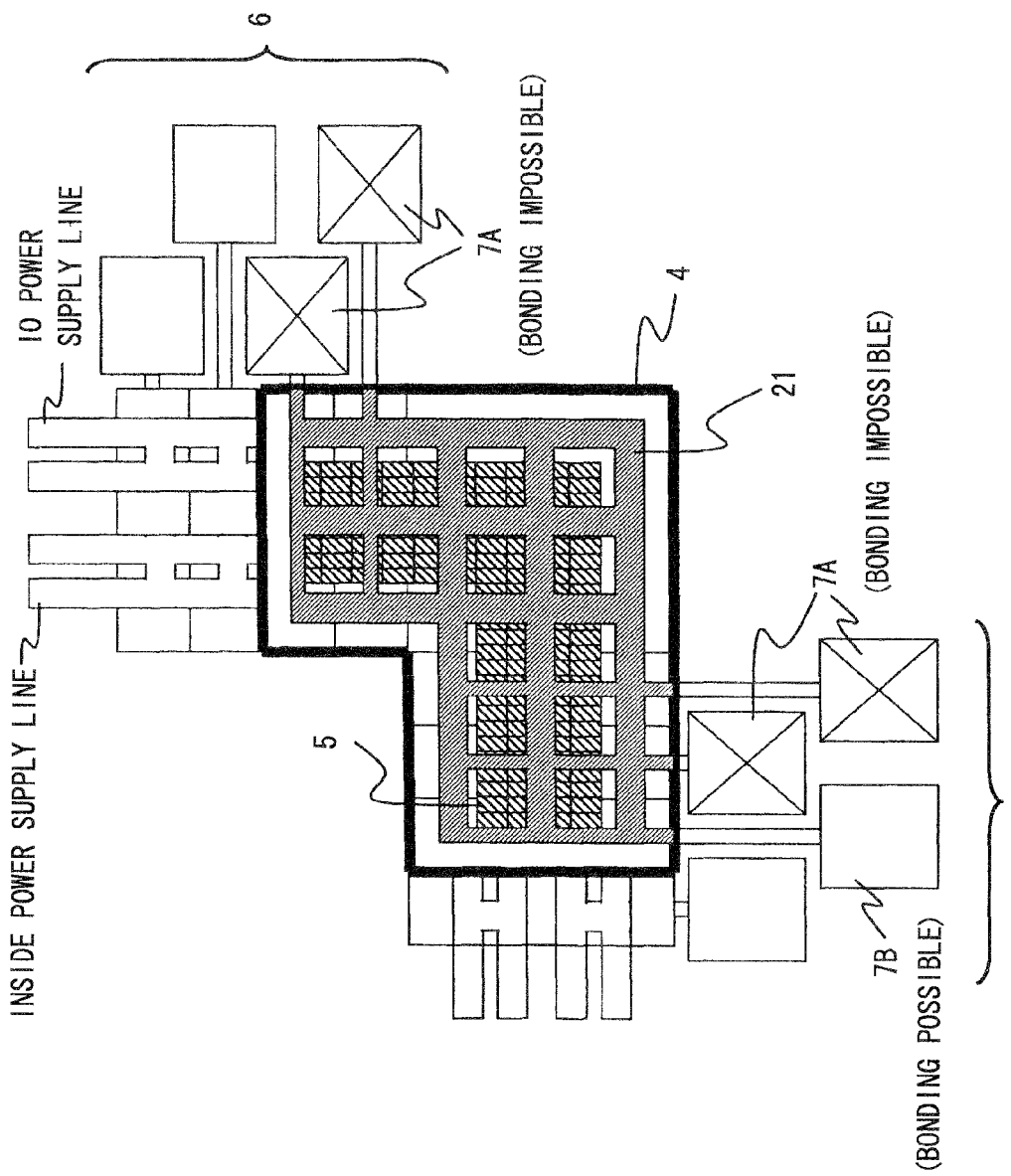
FIG. 2 is a view showing a fuse macro according to the embodiment.

FIG. 2 is a view showing a detail of the fuse macros 4 according to the embodiment. The fuse macro 4 of the embodiment includes the fuse portions 5 and wires for blowing fuse 21. As described above, the fuse portions 5 are able to be electrically fused and wires for blowing fuse 21 are formed by a wire layer formed in the upper layer of the corners of the active region 10. Hereinafter, the reason why the semiconductor chip is able to be downsized by using the fuse macros 4 of the embodiment will be explained.

In FIG. 2, the pads for fuse 7 are also shown. The pads for fuse 7 of FIG. 2 include bonding pads 7A which cannot be connected to external terminals and bonding pads 7B which can be connected to external terminals when the semiconductor device is implemented. Hereinafter the bonding pads 7A which cannot be bonded and bonding pads 7B which can be bonded will be explained with reference to FIG. 3.

Figure 3:
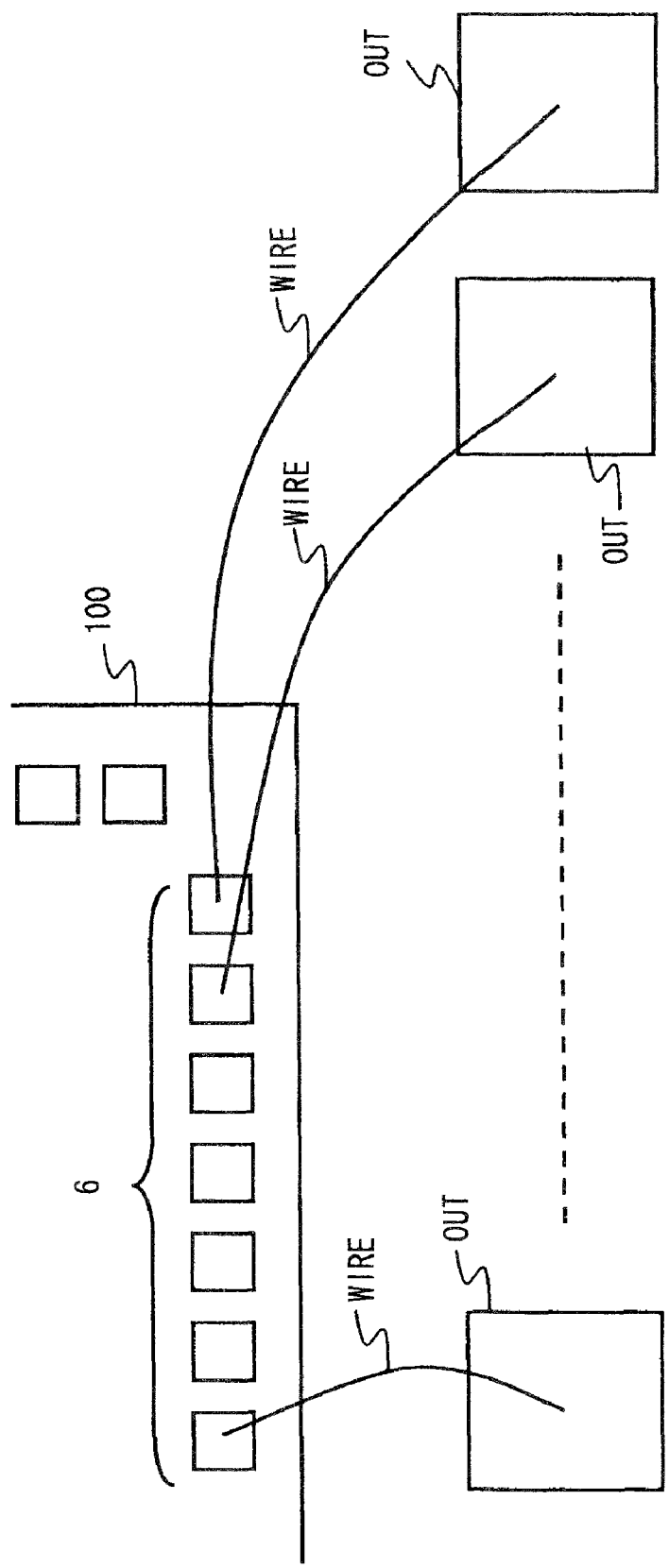
FIG. 3 is a schematic diagram explaining a pad which cannot be bonded.

FIG. 3 is a view showing pads of the pad line 6, external terminals OUT connected to the pads, and wires WIRE bonding the external terminals and pads after the chip is mounted. As shown in FIG. 3, when the terminals of ends of the pad line 6 are bonded with the external terminals OUT by wire bonding or the like, the angle between the wire and the chip becomes steeper in the ends of the pad line 6. A wire shortcircuit may be caused in the wires which are connected to the pads of the ends of the pad line Therefore these pads are not used for bonding when the semiconductor chip is implemented. Usually, pads near the corner of the chip and buffers connected to the pads are not connected to the core circuit. Therefore in a conventional semiconductor device, chip corner, that is pads near the active region corner and the buffer region are not effectively used, so waste region is formed near the chip corner.

However in the present embodiment, the fuse macros 4 are located near the corners of the active region 10. Further the fuse portions 5 which are arranged in the fuse macros 4 are able to be electrically fused. This fusing of the fuse is performed when the defect of the memory element is relieved by a redundancy element, so the fusing is done at a probing stage which is performed before implementing.

That is, in this embodiment, the fuse is able to be fused by using pads and buffer areas which are formed as waste areas in the conventional technique by arranging the fuse macros 4 near the corners of the active region 10 and fusing the fuse at the proving stage by using the ends of the pad line 6 and pads for fuse which are arranged near the ends.

Further, according to the fuse macros 4 of the present embodiment, it is possible to form high-density wire layer for fusing several wire layers arranged in an upper layer of the corner of the active region. If the fuse macros 4 are not arranged in the corner of the active region 10, a wire other than the power supply wire is rarely formed on the upper layer of the corner of the active region. On the other hand, according to this embodiment, it is possible to form a high-density wire for fusing by using several wires at the upper layer of the fuse macros 4 without affecting wire of the core circuit forming region 1. Further, even if the power supply wire of the corner of the active region 10 is removed, as the power supply wire is generally formed by power supply mesh, it is possible to form a wire for fusing without affecting the buffer circuit.

Furthermore, the fuse macros 4 themselves can be arranged at the corners of the active region 10 without being arranged outside of the core circuit forming region 1 or the pad forming region 3. Therefore it is possible to arrange the fuse element without increasing a semiconductor chip area.

Further, in fusing the fuse, a probe pin is pressed on three pads including pads that cannot be bonded 7A and pads that can be bonded 7B shown in FIG. 2, and voltage is applied to the pads. After that, the fuse is fused and when the semiconductor chip is implemented, voltage of one end of fuse element is secured by bonding the pads that can be bonded 7B to the power supply VDD. When the semiconductor chip is implemented, the bonding pads 7A are not bonded, and there is no possibility that the adjacent wires are shorted out. According to the embodiment, it is possible to increase current amount in fusing and to fuse the fuse without fail by using several terminals as the fuse elements.

It is apparent that the present invention is not limited to the above embodiments, but may be modified and changed without departing from the scope and spirit of the invention.

For example, we explained the case where the fuse macros are arranged to each four corner of the active region in the embodiment. But the fuse macros need not be arranged to each of the four corners. One to three fuse macros may be arranged to any corner of the active region in accordance with the memory capacity of the core circuit or the memory arrangement.

What is claimed is:

1. A semiconductor device comprising:
    an active region including a core circuit forming region and a buffer forming region;
    a fuse element forming region arranged on a corner of the active region and to be able to be electrically fused; and
    a wire for fusing connected to a fuse of the fuse element forming region, said wire for fusing being formed in plural wire layers in an upper layer of the corner,
    wherein said active region and said fuse element are in a same semiconductor chip.

2. The semiconductor device according to claim 1 further comprising:
    a pad forming region to be arranged around the buffer forming region,
    wherein a pad formed near the corner of the active region is electrically connected to a fuse formed in the fuse element forming region.

3. The semiconductor device according to claim 2 wherein at least one of pads electrically connected to the fuse is electrically connected to an external terminal.

* * * * *